United States Patent
Tsay

(12) 
(10) Patent No.: US 6,268,271 B1
(45) Date of Patent: Jul. 31, 2001

(54) METHOD FOR FORMING BURIED LAYER INSIDE A SEMICONDUCTOR DEVICE

(75) Inventor: Kuen-Shyi Tsay, I-Lan (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/583,423

(22) Filed: May 31, 2000

(51) Int. Cl.$^7$ .................................................. H01L 21/425
(52) U.S. Cl. ........................... 438/524; 438/526; 438/499; 438/505; 438/506
(58) Field of Search .................................. 438/429, 488, 438/499, 505, 506, 508, 526, 524

(56) References Cited

U.S. PATENT DOCUMENTS

| | | |
|---|---|---|
| 4,713,358 * | 12/1987 | Bulat et al. . |
| 4,737,468 * | 4/1988 | Martin . |
| 5,476,800 * | 12/1995 | Burton et al. . |
| 5,536,670 * | 7/1996 | Hsue ........................................ 438/524 |
| 5,846,864 * | 12/1998 | Hsu ......................................... 438/524 |

* cited by examiner

*Primary Examiner*—Trung Dang

(57) ABSTRACT

A method for forming a plurality of buried layers inside a semiconductor device is disclosed. The method includes the following steps. Firstly, a semiconductor substrate is provided. Then, the first type $p^+$-type ions are implanted into the semiconductor substrate to form the $p^+$-type region under the surface of semiconductor substrate. The semiconductor substrate is etched to form a plurality of concave portions and a plurality of convex portions using the first photoresist. The $n^+$-type ions are second implanted into the semiconductor substrate as a plurality of $n^+$-type region. Next, the oxide layer is deposited over the surface of the plurality of concave portions and the surface of the plurality of convex portions. The plurality of $n^+$-type regions are heated to form as the buried layers. The oxide layer is removed. Finally, a silicon layer is formed to fill the plurality of concave of portions a silicon layer and to cover the surface of the plurality of convex portions.

14 Claims, 8 Drawing Sheets

METHOD FOR FORMING BURIED LAYER INSIDE A SEMICONDUCTOR DEVICE

BACKGROUND OF THE INVENTION

1. Field of the Invention

The invention relates the formation of a plurality of buried layers more particularly using as buried layers inside a semiconductor device.

2. Description of the Prior Art

Firstly, as shown in FIG. 1A, a semiconductor substrate 101, nitride layer 102 and p$^+$-type 103 are provided.

Then, as shown FIG. 1B, p$^+$-type buried layers 103 are removed by the conventional etching.

Then, as shown in FIG. 1C, the n$^+$-type ions are implanted into the semiconductor substrate 101 as a plurality of n$^+$-type regions 104 located under the surface of the plurality of concave portions.

Next, as shown in FIG. 1D, the oxide layer 105 is deposited over the surfaces of the plurality of concave portions and the surface of the plurality of convex portions. Finally, a silicon layer 106 is formed to fill the plurality of concave portions a silicon layer and to cover the surfaces of the plurality of convex portions.

SUMMARY OF THE INVENTION

In accordance with the present invention, a method is provided for forming a plurality of buried layers that substantially reduces p$^+$-type buried region defect.

In the preferred embodiment, the process steps can be reduced to fewer than are used in the prior art, also, such that economic benefits can be increased.

In the preferred embodiment, firstly, a semiconductor substrate is provided. Then, the first p$^+$-type ions are implanted into the semiconductor substrate to form the p$^+$-type region under the surface of semiconductor substrate. A first photoresist having a specific pattern is formed on the surface of the semiconductor substrate as an etching mask. The semiconductor substrate is etched to form a plurality of concave portions and a plurality of convex portions using the first photoresist. Then, the first photoresist is removed. A second photoresist is formed to cover the plurality of convex portions. THe n$^+$-type ions are second implanted into the semiconductor substrate as a plurality of n$^+$-type regions located under the surface of the plurality of concave portions using a second photoresist which covers the plurality of convex portions. The second photoresist is removed. Next, the oxide layer is deposited over the surface of the plurality of concave portions and the surface of the plurality of convex portions. The plurality of p+/n+-type regions are heated to form the buried layers. The oxide layer is removed. Finally, a silicon layer is formed to fill the plurality of concave portions a silicon layer and to cover the surface of the plurality of convex portions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a preferred embodiment directed to a buried layer, it is not intended that these illustrations be a limitation on the scope or applicabilty, of the present invention. Further, while the illustrative examples use nitride, it should be recognized that the nitride portions might be replaced with other materials. Thus, it is not intended that the semiconductor devices of the present invention be limited to the structures illustrated. These devices are included to demonstrate the utility and application of the present invention to presently preferred embodiments.

The spirit of the proposed invention can be explained and understood by the following embodiments with corresponding FIGS. 2A to 2K.

Figure 1A:
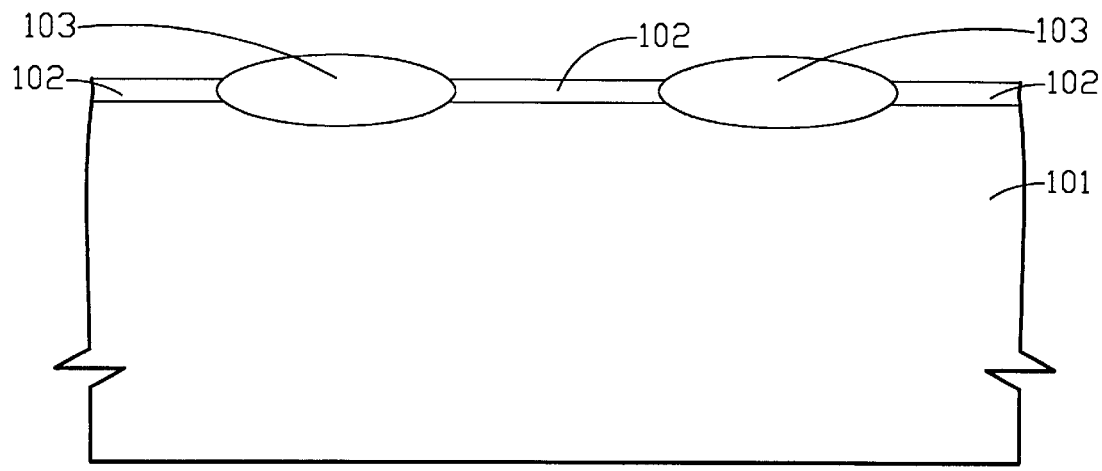
FIGS. 1A and 1D are illustrative of various cross-sections of the structure of the prior art.
Figure 1B:
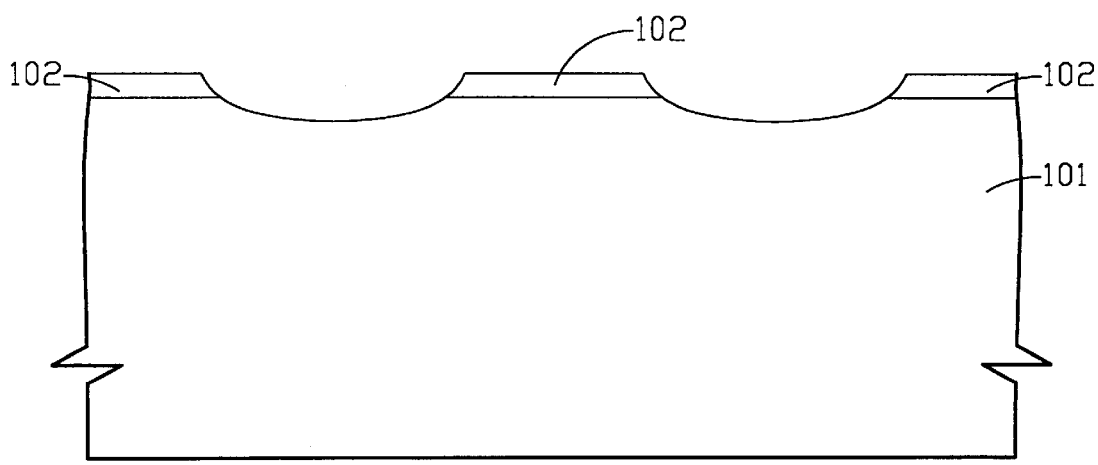
Figure 1C:
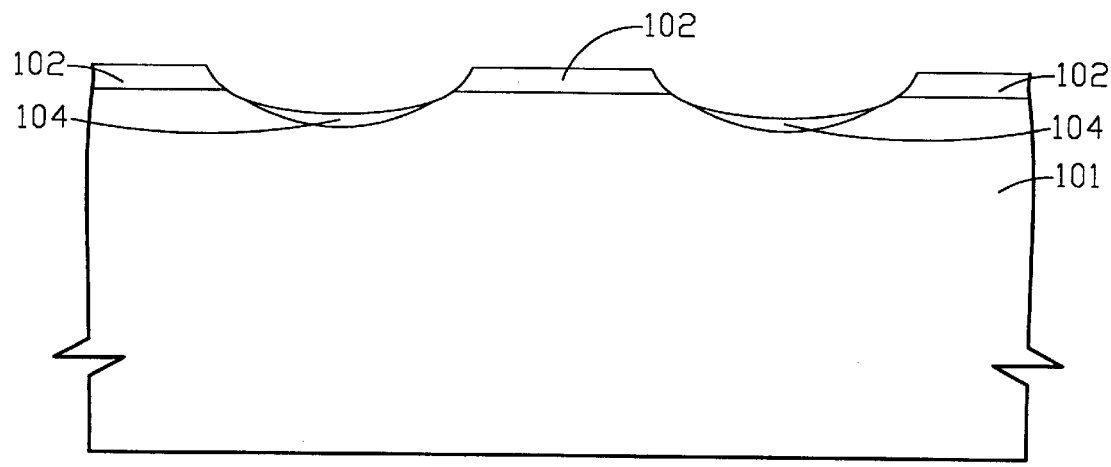
Figure 1D:
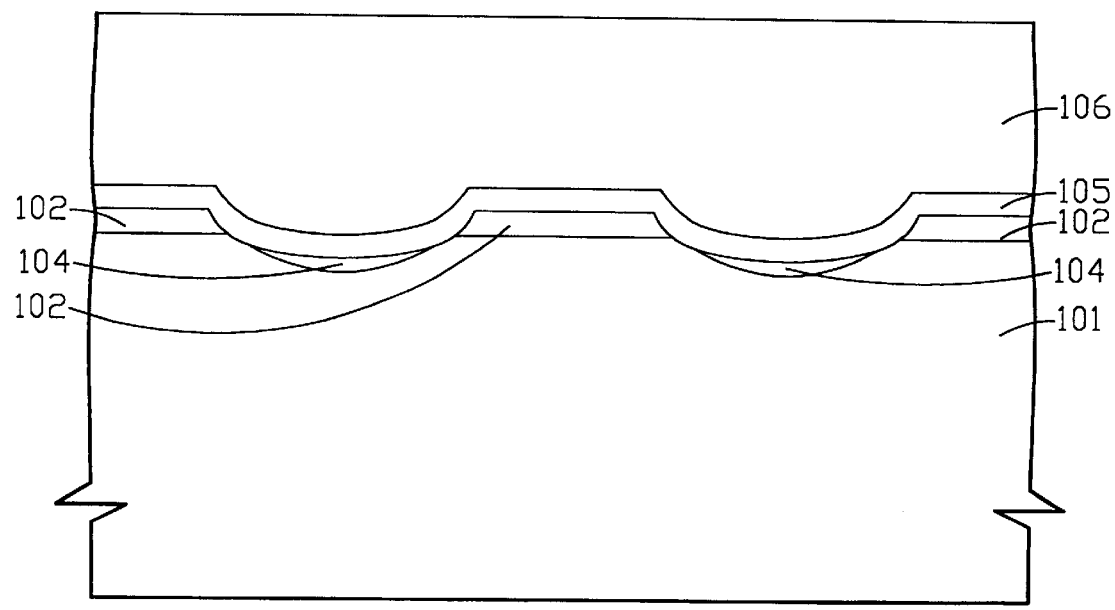
Figure 2A:
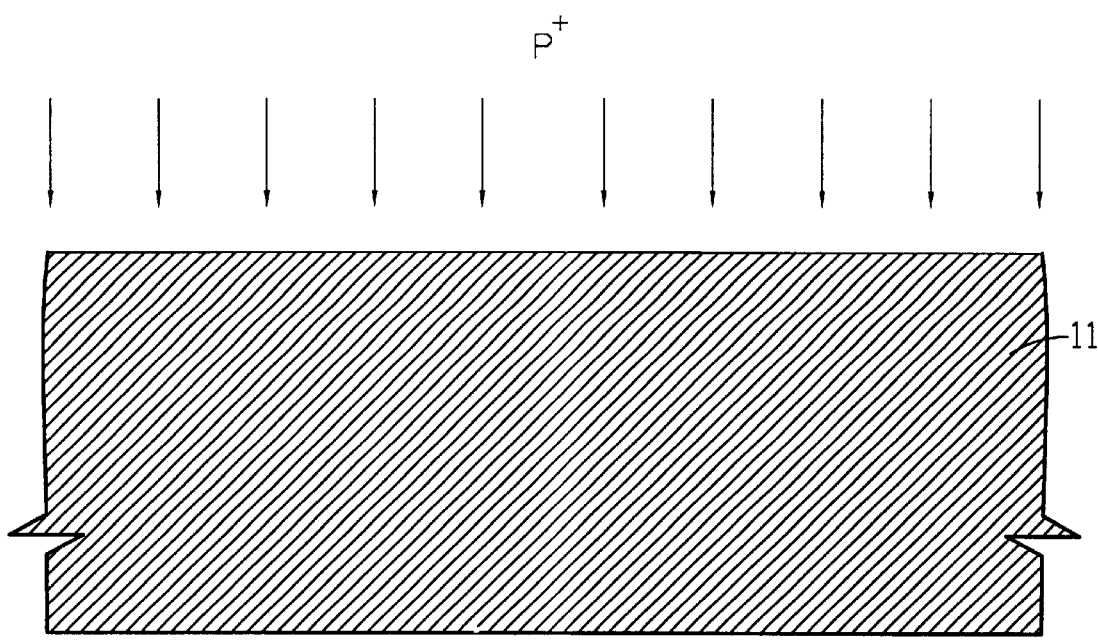
FIGS. 2A and 2K are schematic diagrams showing the structure of the embodiment of present invention.
Figure 2B:
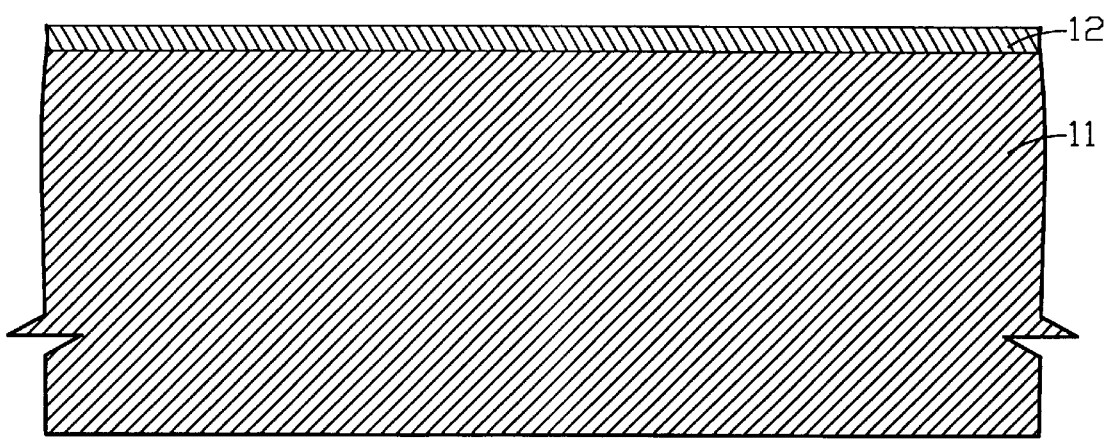

With reference to FIG. 2A, the substrate according to the present invention is schematically shown. Specifically, a semiconductor substrate 11 is provided. Then, the first p$^+$-type ions such as BF$_2$+ions are first implanted into the semiconductor substrate 11 to form the p$^+$-type region 12 under the surface of semiconductor substrate 11 as FIG. 2B. The concentration of the previous implanting is about 3E 15 ions/cm$^2$.

Figure 2C:
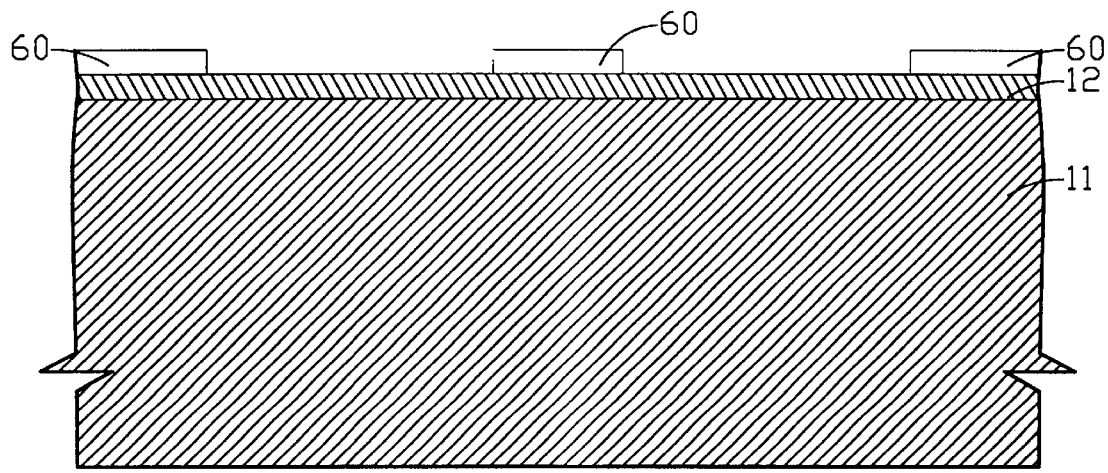

As shown in FIG. 2C, a first photoresist 60 owning a specific pattern is formed using conventional photolithography on the surface of the semiconductor substrate 11 as an etching mask.

Figure 2D:
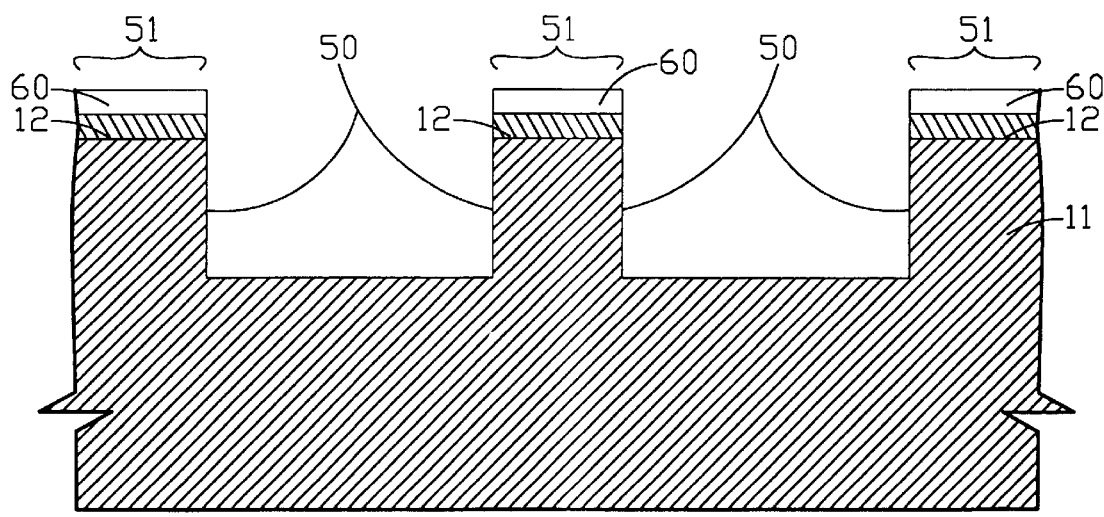

As shown in FIG. 2D, The semiconductor substrate 11 is etched by the conventional dry plasma etching to form a plurality of concave portion 50 and a plurality of convex portion 51 by using the first photoresist 60.

Figure 2E:
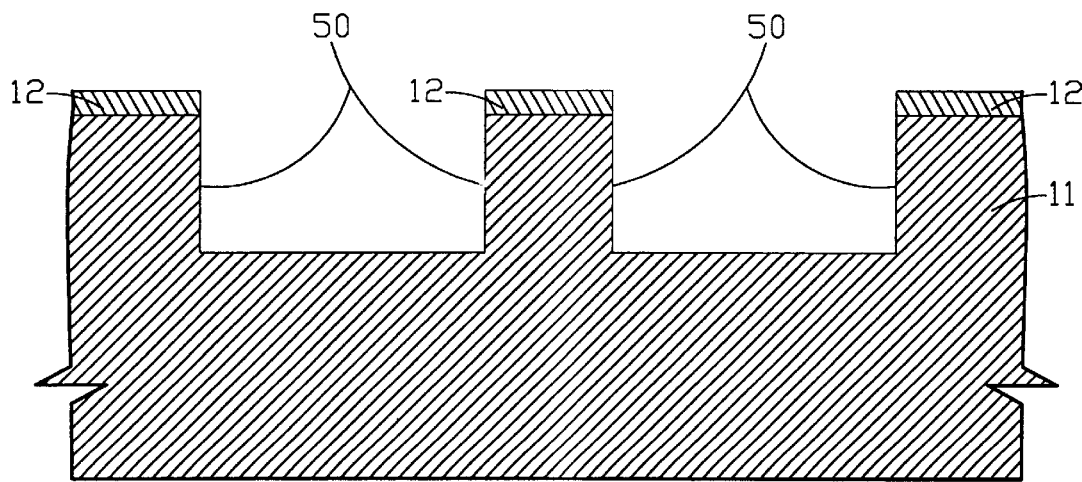

Then, as shown in FIG. 2E, the first photoresist 60 is removed by the conventional dry plasma etching.

Figure 2F:
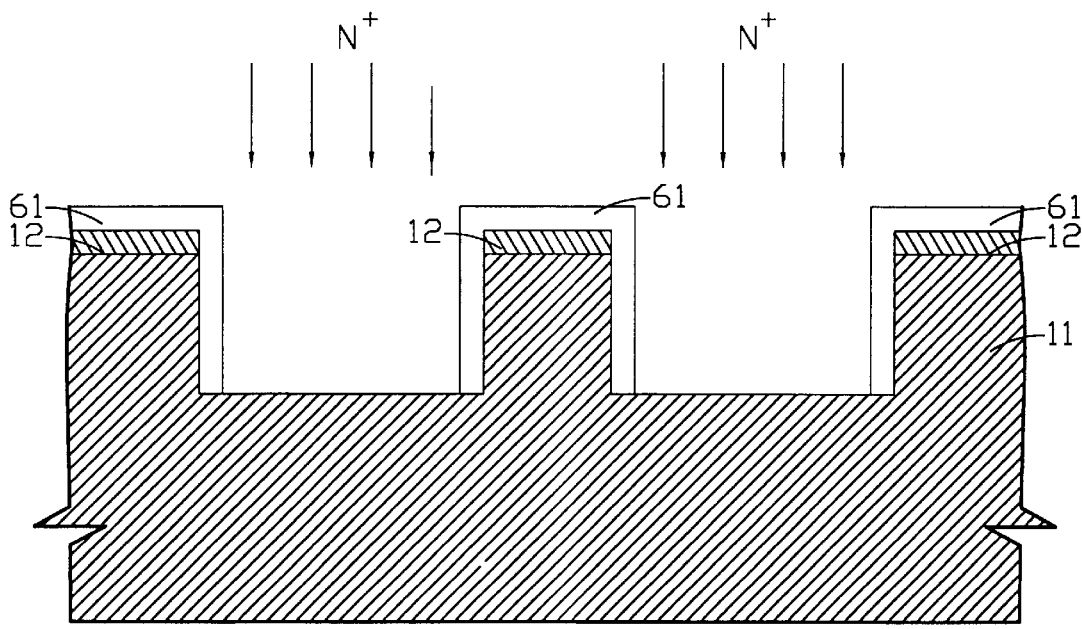
Figure 2G:
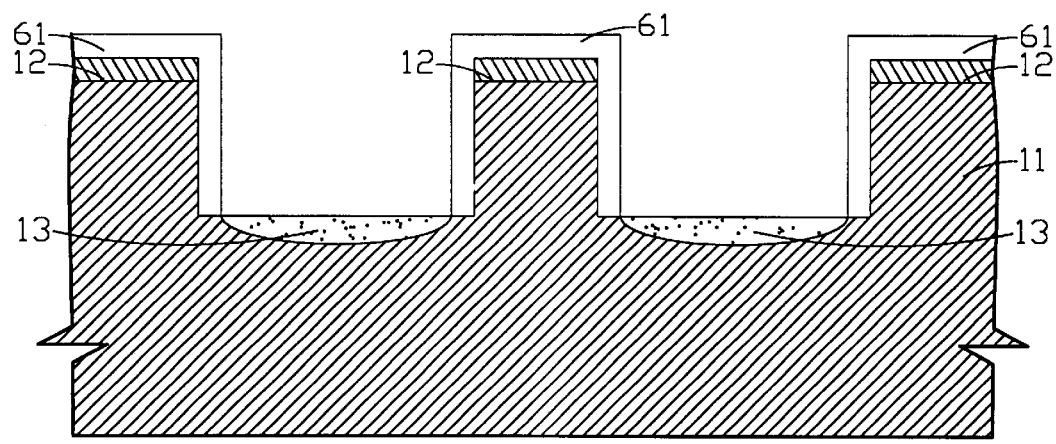

As shown in FIG. 2F, a second photoresist 61 is formed by the conventional lithography to cover on the plurality of convex portion 51. The n$^+$-type ions such as P$^+$ ions are second implanted into the semiconductor substrate 11 as a plurality of n$^+$-type region 13 located under the surface of the plurality of concave portion by using a second photoresist which covers the plurality of the convex portions as FIG. 2G. The concentration of the second implanting is about 4E14 ions/cm$^2$.

Figure 2H:
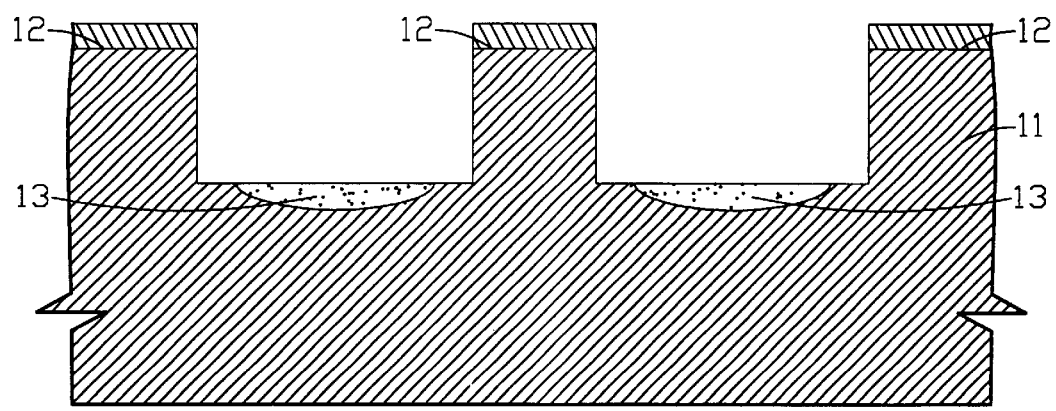

As shown in FIG. 2H, the second photoresist 61 is removed by using the conventional dry plasma etching.

Figure 2I:
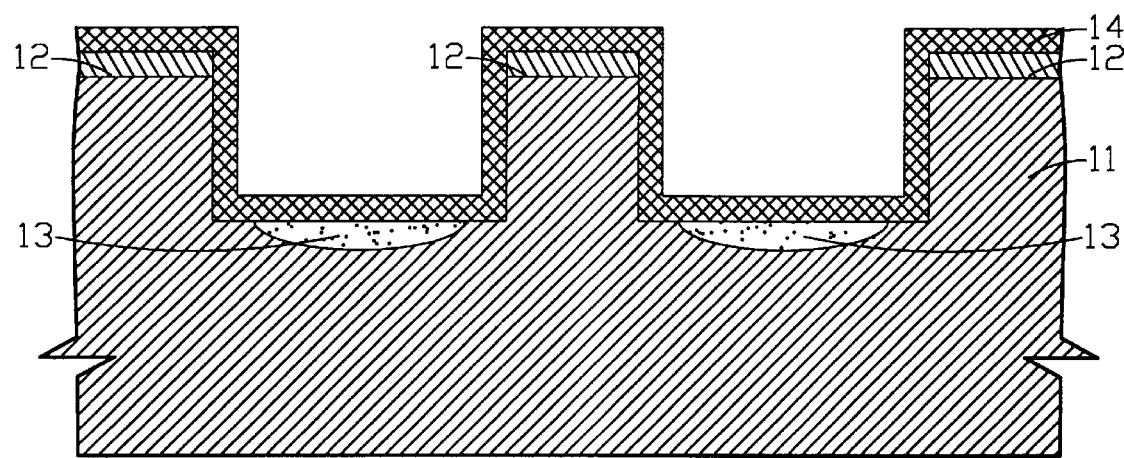

Next, as shown in FIG. 2I, the oxide layer 14 such as TEOS silicon dioxide is deposited over the surface of the plurality of concave portion 50 and the surface of the plurality of convex portion 51. The depth of this oxide layer is about 300 angstroms. The formation temperature is about 600° C. to 700° C. and the formation pressure is about few torrs. Sequentially, the plurality of p$^+$/n$^+$-type region 13 are heated to form as the buried layers. The heating process is achieved by the rapid thermal process, which the temperature is about 1100° C. and the duration time is about 4 hours.

Figure 2J:
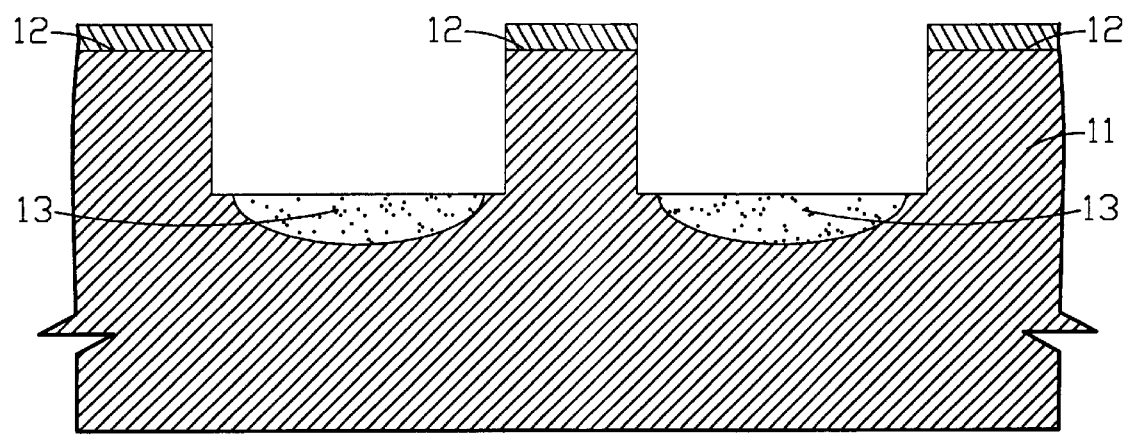

As shown in FIG. 2J, the oxide layer 14 such as TEOS silicon dioxide is removed by the conventional wet etching.

Figure 2K:
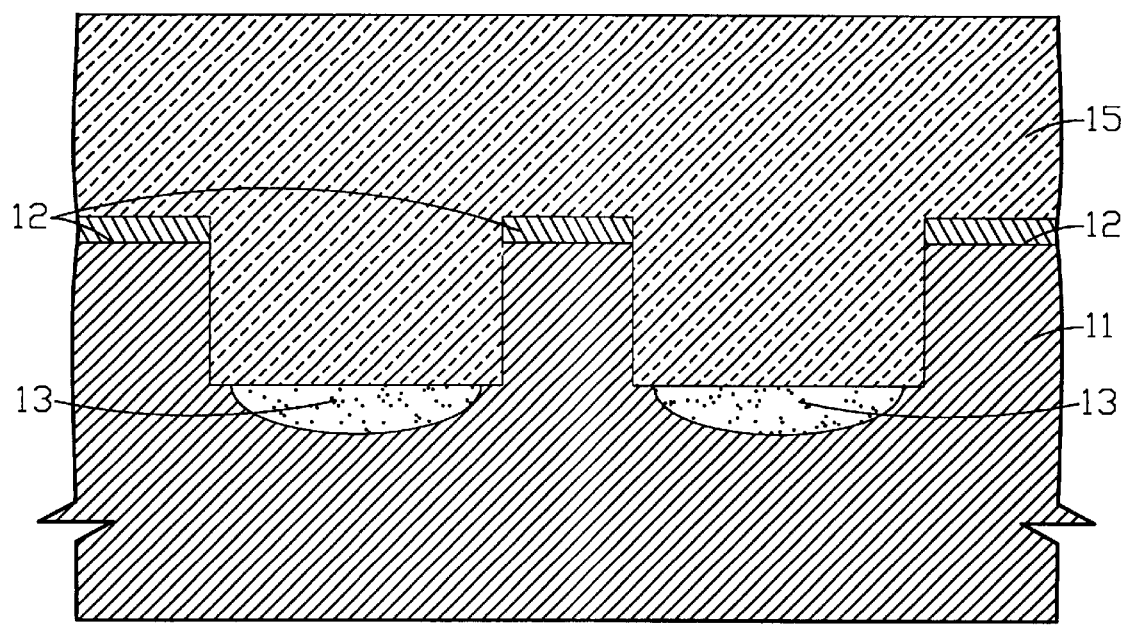

Finally, as shown in FIG. 2K, a silicon layer 15 is formed by the conventional epitaxy to fulfill the plurality of concave portion 50 and to cover the surface of the plurality of convex portion 51. Especially the epitaxy temperature is about 1130° C.

According to the present invention, a method is provided for forming a plurality of buried layers that substantially reduces p⁺-type buried region defect. At the same time the process steps in the preferred embodiment can be reduced to a number less than that of the prior art. Also, the economic benefit can be increased due to the reduction of the tensile stress of the silicon nitride layer.

Therefore, in summary, the method for forming double buried layers inside a semiconductor device according to the present invention includes the following steps:

Firstly, a semiconductor substrate is provided. Then, the first p⁺-type ions are implanted into the semiconductor substrate to form the p⁺-type region under the surface of semiconductor substrate. A first photoresist having a specific pattern is formed on the surface of the semiconductor substrate as an etching mask. The semiconductor substrate is etched to form a plurality of concave portions and a plurality of convex portions using the first photoresist. Then, the first photoresist is removed. A second photoresist is formed to cover the plurality of convex portions. The n⁺-type ions are second implanted into the semiconductor substrate as a plurality of n⁺-type regins located under the surface of the plurality of concave portion by using a second photoresist which covers the plurality of convex portions. The second photoresis is removed. Next, the oxide layer is deposited over the surface of the plurality of concave portions and the surface of the plurality of convex portions. The plurality of p⁺/n⁺-type region are heated to form the buried layers. The oxide layer is removed. Finally, a silicon layer is formed to fill the plurality of concave portions a silicon layer and to cover the surface of the plurality of convex portions.

What is claimed is:

1. A method for forming a plurality of buried layers inside a semiconductor device, comprising:

providing a semiconductor substrate;

first implanting ions of a first conductivity type into the semiconductor substrate to form a layer of the first conductivity type under the surface of semiconductor substrate;

etching the semiconductor substrate to form a plurality of concave portions and a plurality of convex portions by using a first photoresist;

second implanting ions of a second conductivity type into the semiconductor substrate to form a plurality of the regions of the second conductivity type located under the surface of the plurality of the concave portions by using a second photoresist which covers the plurality of the convex portions;

depositing an oxide layer over the surface of the plurality of the concave portions and the surface of the plurality of the convex portions;

heating the plurality of the regions of the second conductivity type to form said buried layers;

removing the oxide layer; and forming a silicon layer to fill the plurality of the concave portions and to cover the surface of the plurality of the convex portions.

2. The method according to claim 1, wherein said ions of the first conductivity type comprise $BF_2^+$ ions.

3. The method according to claim 1, wherein said ions of the second conductivity type comprise $P^+$ ions.

4. The method according to claim 1, wherein said oxide layer comprises TEOS oxide layer.

5. The method according to claim 1, wherein the depth of said oxide layer is about 3000 angstroms.

6. The method according to claim 1, wherein said heating step comprises rapid thermal process.

7. The method according to claim 1, wherein said forming said silicon layer comprises epitaxy said silicon layer.

8. A method for forming a plurality of buried layers inside a semiconductor device, comprising:

providing a semiconductor substrate;

first implanting ions of a first conductivity type into the semiconductor substrate to form a layer of the first conductivity type under the surface of semiconductor substrate;

forming a first photoresist having a specific pattern on the surface of the semiconductor substrate as an etching mask;

etching the semiconductor substrate to form a plurality of concave portions and a plurality of convex portions by using the first photoresist;

removing the first photoresist;

forming a second photoresist to cover on the plurality of convex portion;

second implanting ions of a second conductivity type into the semiconductor substrate to form a plurality of regions of the second conductivity type located under the surface of the plurality of the concave portions by using a second photoresist which covers the plurality of the convex portions;

removing the second photoresist;

depositing an oxide layer over the surface of the plurality of the concave portions and the surface of the plurality of the convex portions;

heating the plurality of the regions of the first conductivity type to form said buried layers;

removing the oxide layer; and forming a silicon layer to fill the plurality of the concave portions and to cover the surface of the plurality of the convex portions.

9. The method according to claim 8, wherein said ions of the first conductivity type ion comprise $BF_2^+$ ions.

10. The method according to claim 8, wherein said ions of the second conductivity type ion comprise $P^+$ ions.

11. The method according to claim 8, wherein said oxide layer comprises TEOS oxide layer.

12. The method according to claim 8, wherein the depth of said oxide layer is about 3000 angstroms.

13. The method according to claim 8, wherein said heating step comprises rapid thermal process.

14. The method according to claim 8, wherein said forming said silicon layer comprises epitaxy said silicon layer.

* * * * *